United States Patent [19]

Kosugi et al.

[11] Patent Number: 5,192,213
[45] Date of Patent: Mar. 9, 1993

[54] NEST TYPE PRESSURE CONNECTING DEVICE

[75] Inventors: Motoki Kosugi, Tokyo; Noriyuki Matsuoka; Toru Takahashi, both of Yokohama, all of Japan

[73] Assignee: Yamaichi Electric Co., Ltd., Tokyo, Japan

[21] Appl. No.: 851,797

[22] Filed: Mar. 17, 1992

[30] Foreign Application Priority Data

Mar. 27, 1991 [JP] Japan ............................. 3-87484

[51] Int. Cl.$^5$ .............................................. H01R 9/09
[52] U.S. Cl. ...................................... 439/66; 439/81; 439/83; 439/247; 439/591
[58] Field of Search .................... 439/66, 71, 81, 83, 439/247, 248, 265, 700, 908, 591

[56] References Cited

U.S. PATENT DOCUMENTS 4,838,801  6/1989  Bertoglio et al. ..................... 439/66
5,106,328  4/1992  Prochaska et al. .................. 439/81

FOREIGN PATENT DOCUMENTS 63-25467  2/1988  Japan .

Primary Examiner—Paula A. Bradley
Attorney, Agent, or Firm—Wenderoth, Lind & Ponack

[57] ABSTRACT

A inner jacket member 1 having slit elements 1a is inserted into an outer jacket member 2. An inner jacket member pressing portion, 4, 13 for closing or dilating the inner jacket member 1 is formed within said outer jacket member 2 in such a manner as to be opposite the front end portions 1b of the split elements 1 a. A male terminal 7, 8 to be contacted with an electric part, such as the leadless IC or the like, under pressure is disposed at a tail end of either of the outer and inner jacket members 2 and 1.

5 Claims, 4 Drawing Sheets

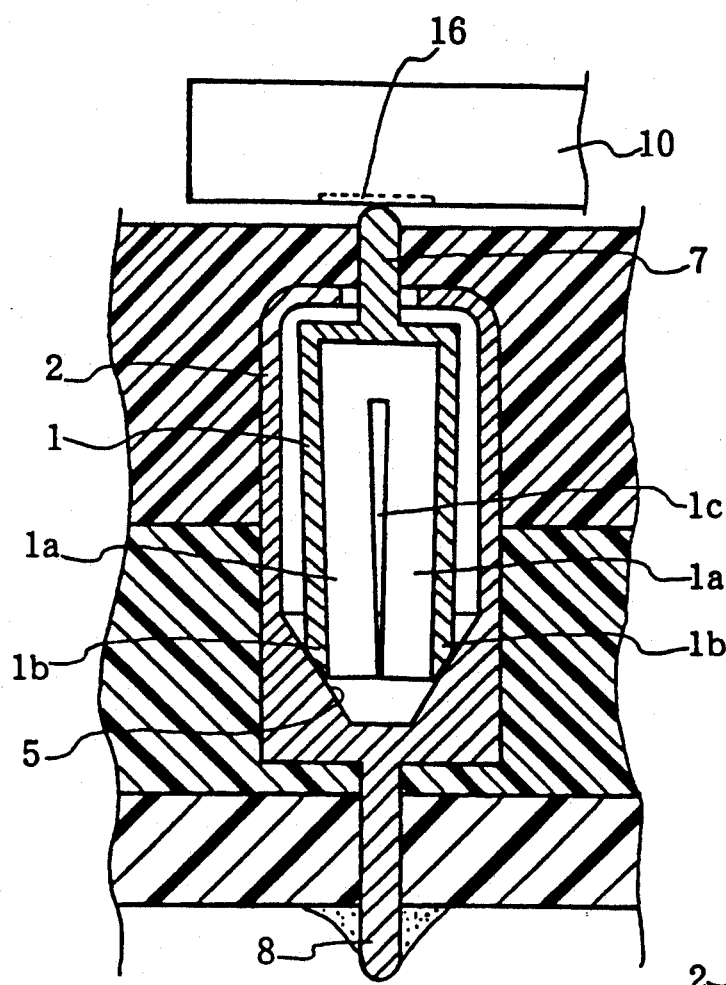
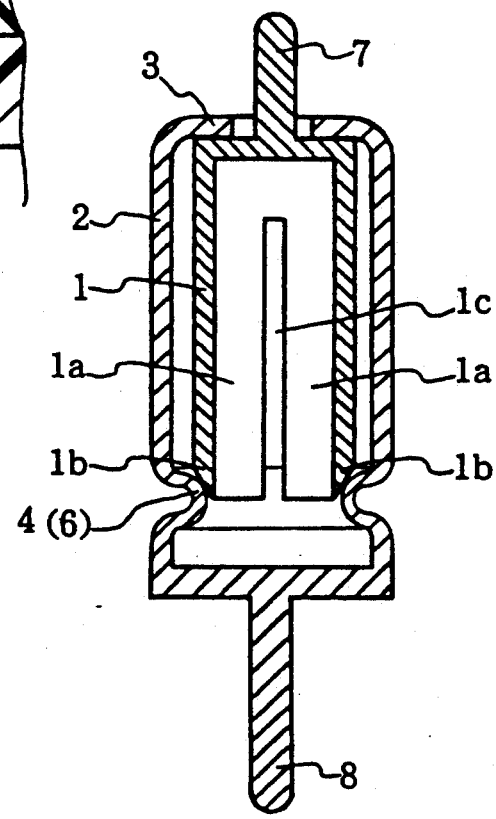

NEST TYPE PRESSURE CONNECTING DEVICE

BACKGROUND OF THE INVENTION

1. Field of the Invention

This invention relates to a nest type pressure connecting device suitable to be used for contacting an electric part such as leadless IC or the like which has a number of conductive pads (terminals) on its lower surface.

2. Brief Description of the Prior Art

A conventional pressure connecting device of this type, as disclosed in Japanese Utility Model Early Laid-open Publication No. Sho 63-25467, includes an outer jacket member having a stationary terminal, a coil spring and a movable terminal to be inserted into one end of an opening of the outer jacket member such that the movable terminal is resiliently held by the coil spring, the end of the opening in the outer jacket member being, by way of example, reduced inwardly in order to prevent the coil spring and movable terminal from escaping therefrom, an inner bottom portion of the outer jacket member and an inner end portion of the movable terminal being provided with a recess portion, respectively, the end portion of the coil spring being inserted into and supported by both the recess portions, whereby the movable terminal is pushed down by the electric pads of an electric part to compress the coil spring, so that the movable terminal is elastically caused to contact the conductive pad of the electric part by a bias of the coil spring.

The pressure connecting device thus constructed has such problems that a coil spring must be prepared as a separate part in addition to an outer jacket member and an inner jacket member, and therefore, the number of component parts required is increased, thus resulting in high cost.

Furthermore, a bias is generated to the coil spring to incline the movable terminal when an electric part is mounted, with the results that the contact pressure is not uniform and the sliding movement of the movable terminal in the axial direction is not smooth. Moreover, the repeated use of the coil spring is likely to deteriorate its elasticity.

SUMMARY OF THE INVENTION

It is therefore an object of the present invention to provide, in a connector for the use of a leadless IC or the like, a nest type pressure connecting device able to provide a correct electrical contact with respect to conductive pads which are arranged in high density on a lower surface of an IC.

Another object of the present invention is to provide a nest type pressure connecting device, in which the number of component parts can be reduced.

To achieve the above objects, according to the present invention, an inner jacket member having split elements is nested within an outer jacket member, the outer jacket member being provided therein with an inner jacket member pushing portion placed opposite a front end portion of the inner jacket member and adapted to push the front end portions of the slit elements of the inner jacket member inwardly from outside so that the front end portions of the slit elements are closed, or an inner jacket member pushing portion placed opposite the front end portion of the inner jacket member and adapted to push the front end portions of the slit elements of the inner jacket member outwardly from inside so that the front end portions of the slit elements are dilated, a male terminal disposed at a tail end of either of the outer jacket member and inner jacket member being contacted with an electric part by means of a restoring force of the slit elements at the time the slit elements are closed or dilated.

According to the present invention, when the inner jacket member is pushed into the outer jacket member by depressing the electrical part which is mounted on the male terminal for electrical contact, the split elements of the inner jacket member are flexed by the inner jacket member pushing portion formed within the outer jacket member so that they are closed or dilated, and the inner and outer jacket members are then relatively expanded by the elastic restoring force of the split elements to cause the male terminal to push up the conductive pad, thereby to provide a correct pressure contact.

Furthermore, since the constitution of the present invention is such that the split elements formed in the inner jacket member itself are closed and dilated with respect to its axis to provide an elastic force necessary for the abovementioned pressure contact, a generation of a bias as in the coil spring can be effectively prevented. As a result, there can be obtained a uniform contact pressure. Moreover, an axial expansion and contraction can be performed smoothly. In addition, the present invention can provide an intended nest type connector without any coil spring as in the conventional connecting device. Therefore, the number of component parts can be reduced to thereby achieve a cost-reduction.

BRIEF DESCRIPTION OF THE DRAWING

FIG. 2 (B) is likewise a sectional view showing a state in which an electric part is mounted;

FIG. 3 is a sectional view showing another embodiment of the nest type pressure connecting device;

DETAILED DESCRIPTION OF THE EMBODIMENT

Figure 1:
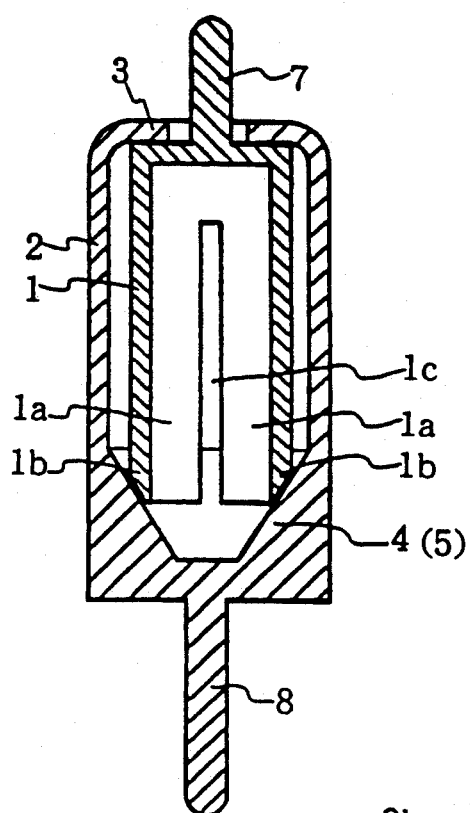
FIG. 1 is a sectional view of a nest type connecting device according to one embodiment of the present invention.

The embodiment of the present invention will be described hereinafter with reference to FIGS. 1 through 7 inclusive. As is shown in FIG. 1, an inner jacket member 1 is inserted into an outer jacket member 2 such that both the members 1 and 2 are coaxially aligned, and an edge 3 of an opening is, by way of example, reduced in order to prevent the inner jacket member 1 from escaping. The inner jacket member 1 has a split groove 1c extending in its axial direction. The split groove 1c is opened up at its front end face and terminated in the vicinity of the other end. A plurality of such split grooves are formed at equal distances in a circumferential direction, and a plurality of split elements 1a are formed by the split grooves 1c. The split elements 1a can be expanded and contracted inwardly and outwardly with reference to the axis of the inner jacket member.

At a location opposite the front end portion 1b of each of the split elements 1a within the outer jacket member 2 is formed an inner jacket member pushing or pressing portion 4. The pushing portion 4, when the inner jacket member 1 is pushed into the outer jacket member 2, pushes the front end portions 1b of the split elements 1a inwardly from outside in order to close the split elements 1a against elasticity thereof, so that the inner jacket member 1 is axially expanded by the restoring force of the split elements 1a.

The inner jacket member pushing portion 4 has a slant pressing portion 5 held opposite the front end portions of the split elements 1a and having an inwardly and downwardly inclined surface. The slant pressing portion 5 is formed in an annular configuration about the axis of the outer jacket member 2 and has an equal gradient over the entire periphery thereof. That is, it has a configuration of an inverted cone, so that when the inner jacket member 1 is pushed into the outer jacket member 2, the front end portions 1b of the split elements 1a are abutted with the inclined surface of the slant pressing portion 5 and pushed inwardly from outside to permit contraction of the closed inner jacket member 1. The outer peripheral surface of the front end portion 1b of each of the split elements 1a is formed in an inclined surface generally matching with the pressing surface of the slant pushing portion 5 and they are placed opposite with each other.

The inner jacket member pushing portion 4 can be a protrusion 6, as shown in FIG. 3, formed on an inner peripheral wall surface of the outer jacket member 2 in such a manner as to be opposite the front end portions 1b of the split elements 1a. The protrusion 6 may be disposed on the inner peripheral wall surface of the outer jacket member 2 in an annular pattern, or otherwise, a plurality of such protrusions 6 may be arranged on the circumference at equal distances in such a manner as to push the centers of the respective splits elements. By reason of the insertion of the inner jacket member 1, the front end portions 1b of the split elements 1a are abutted with the protruded faces of the protrusions 6 and pushed inwardly from outside to thereby close the inner jacket member 1.

Figure 7:
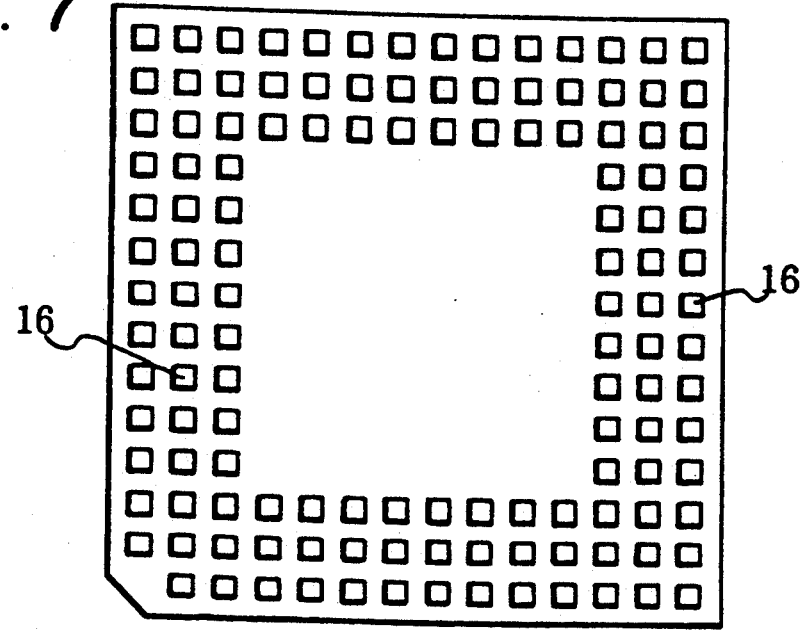
FIG. 7 is a bottom view showing one example of a leadless IC.

FIG. 7 exemplifies a leadless IC 10, as an electric part, in which a number of conductive pads 16 are arranged on a lower surface thereof in a lattice pattern. A male terminal 7 able to contact, under pressure, the conductive pads 16 arranged in high density on the leadless IC 10 is disposed at a tail end of either of the inner and outer jacket members 1 and 2 such that the male terminal 7 is coaxial with the inner and outer jacket members 1 and 2. The other tail end is provided with a male terminal 8 connectable to a wiring board 11. The inner and outer jacket members 1, 2 and male terminal 7 are formed by cutting or casting a metal wire rod material.

Figure 2A:
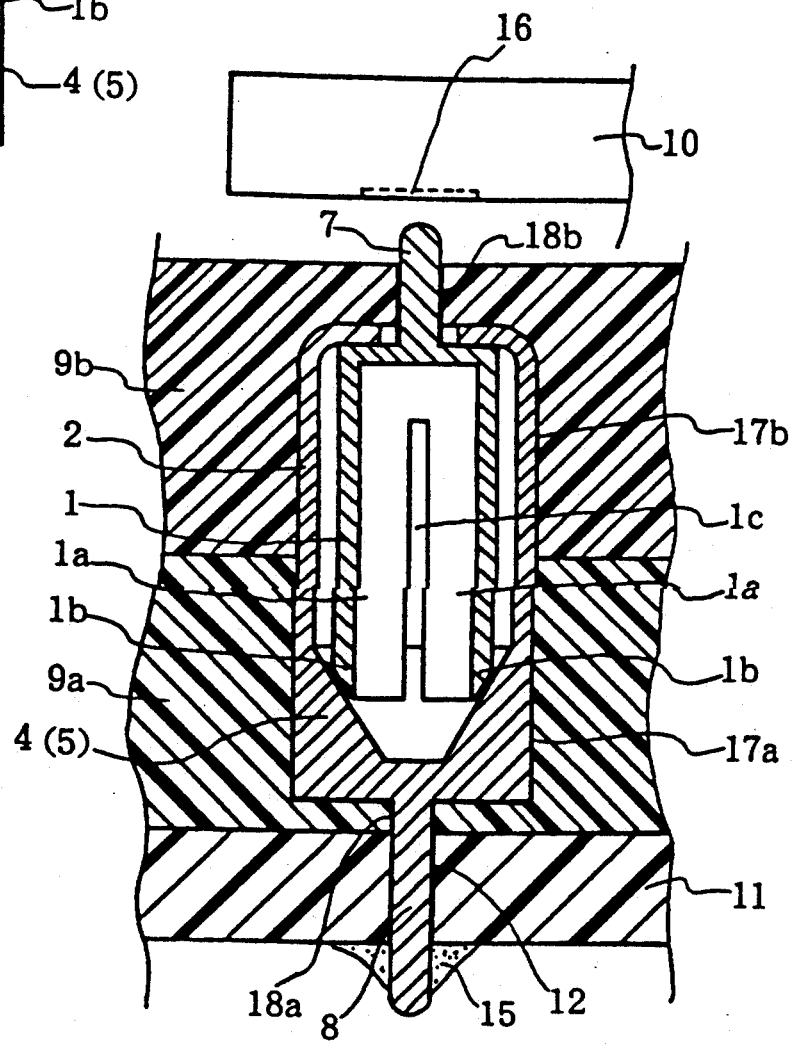
FIG. 2(A) is a sectional view showing a state in which a connector body comprising the pressure connecting device shown in FIG. 1, and an insulating base member with the pressure connecting device disposed therein is mounted on a wiring board.
Figure 4:
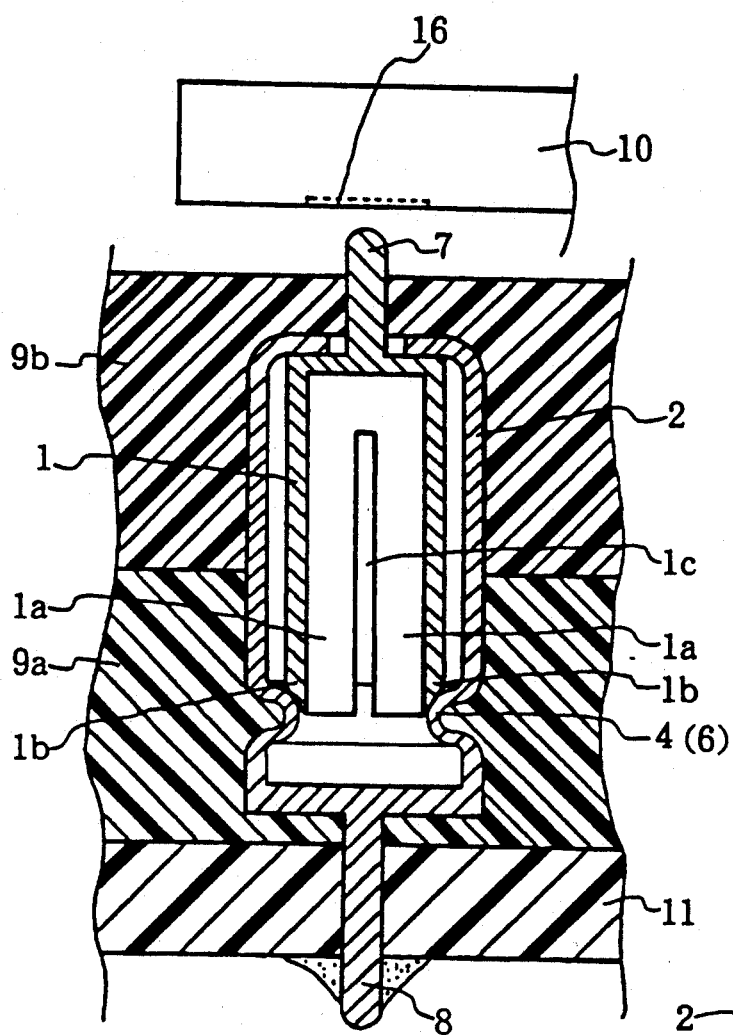
FIG. 4 is a sectional view showing a state that a connector body comprising the pressure connecting device shown in FIG. 3, and an insulating base member with the pressure connecting device disposed therein is mounted on a wiring board.

The pressure connecting device, as shown in FIGS. 2 and 4, comprises a first insulating base member 9a and a second insulating base member 9b provided with recess portions 17a, 17b adapted to receive therein the pressure connecting device, the recess portion 17a of the first insulating base member 9a being formed with a through-hole 18a through which the male terminal 8 is allowed to project, the recess portion of the second insulating base member 9b being formed with a through-hole 18b through which the male terminal 7 is allowed to project, the first and second insulating base members 9a, 9b being placed one upon the other with the pressure connecting device disposed therein, thereby forming a connector body, the male terminals 8, 7 being projected from both the through-holes 18a and 18b or otherwise the connecting device being inserted into the base member to form the same condition. As one example, the connecting device is inserted into the first insulating base member 9a and engaged with the second insulating base member 9b for assembly.

As is shown in FIG. 2B, a terminal of an electric part such as conductive pad 16 of the leadless IC 10, etc. is mounted on the male terminal 7 disposed at a tail end of the inner jacket member 1 in order to obtain an electrical contact therebetween. Then, by pushing down the electric part, the inner jacket member 1 is pushed in and contracted. The pushing-in action of the inner jacket member 1 causes the front end portions 1b of the split elements 1a to be pushed inwardly from outside by the slant pushing portion 5 or protrusion 6 in order to close the split elements 1a against elasticity thereof to allow the above-mentioned contraction. At the same time, the inner jacket member and male terminal are pushed up on the axis by the restoring force of the contraction to provide a contact pressure with the terminal of the electric part.

The male terminal 8 disposed at the tail end of the outer jacket member 2 is inserted into a through-hole 12 in the wiring board 11 and secured to the wiring board 11 by solder 15. On the contrary, it may be designed such that the male terminal 7 disposed at the inner jacket member 1 is connected to the wiring board 1, and the male terminal 8 disposed at the outer jacket member 2 is contacted, under pressure, the conductive pad 16 on the leadless IC 10 shown in FIG. 7.

Figure 5:
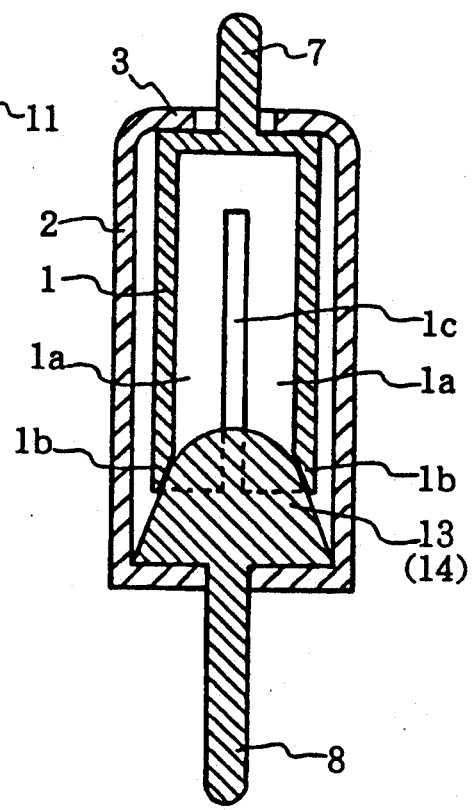
FIG. 5 is a sectional view showing still another embodiment of the nest type pressure connecting device.

FIG. 5 shows another embodiment. As in the preceding embodiment, the split elements 1a with the split grooves 1c formed therein are inserted into the outer jacket member such that the inner and outer jacket members 1 and 2 are coaxial with each other, and the outer jacket member 2 is provided with a pressing portion 13 formed therein in such a manner as to be opposite the front end portions 1b of the split elements 1a of the inner jacket member 1 and adapted to push to split elements outwardly from inside. That is, by pushing the inner jacket member 1 into the outer jacket member 2, the inner jacket member pressing portion 13 pushes the front end portions 1b of the split elements outwardly from inside in order to dilate the inner jacket portion 1 against its resiliency. At the same time, the contraction of the inner jacket member 1 is allowed, and the inner and outer jacket members 1 and 2 are relatively expanded by the restoring force in the closing direction to thereby provide a pressure contact with the electric part.

As one example of the inner jacket member pushing portion 13, a conical slant projecting portion 14 converging inwardly from an inner bottom surface of the outer jacket member 2 is formed within the outer jacket member 2, and the slant projecting portion 14 is inserted into the front end portion of the inner jacket member 1 with the front end portions 1b of the split elements 1a supported on the inclined surface. By pushing the inner jacket member 1 into the outer jacket member 2, the split elements 1a are abutted with the annular inclined surface of the slant projecting portion 14 and evenly pushed outwardly from inside so as to be dilated about the axis and closed along the inclined surface. The inner peripheral surfaces of the front end portions 1b of the split elements 1a are formed in an inclined surface generally matching with the inclined surface of the slant projecting portion 14, and these inclined surfaces are placed opposite with each other.

The inner and outer jacket members 1 and 2 are provided at least at one tail ends thereof with the male terminal 7 adapted to contact, under pressure, the conductive pads 16 arranged in high density on the lower surface of the leadless IC 10 shown in FIG. 7 in such a manner as to be coaxial with the inner and outer jacket members 1 and 2, and the other tail ends are provided with the mail terminal 8 to connected to the wiring board 11.

Figure 6:
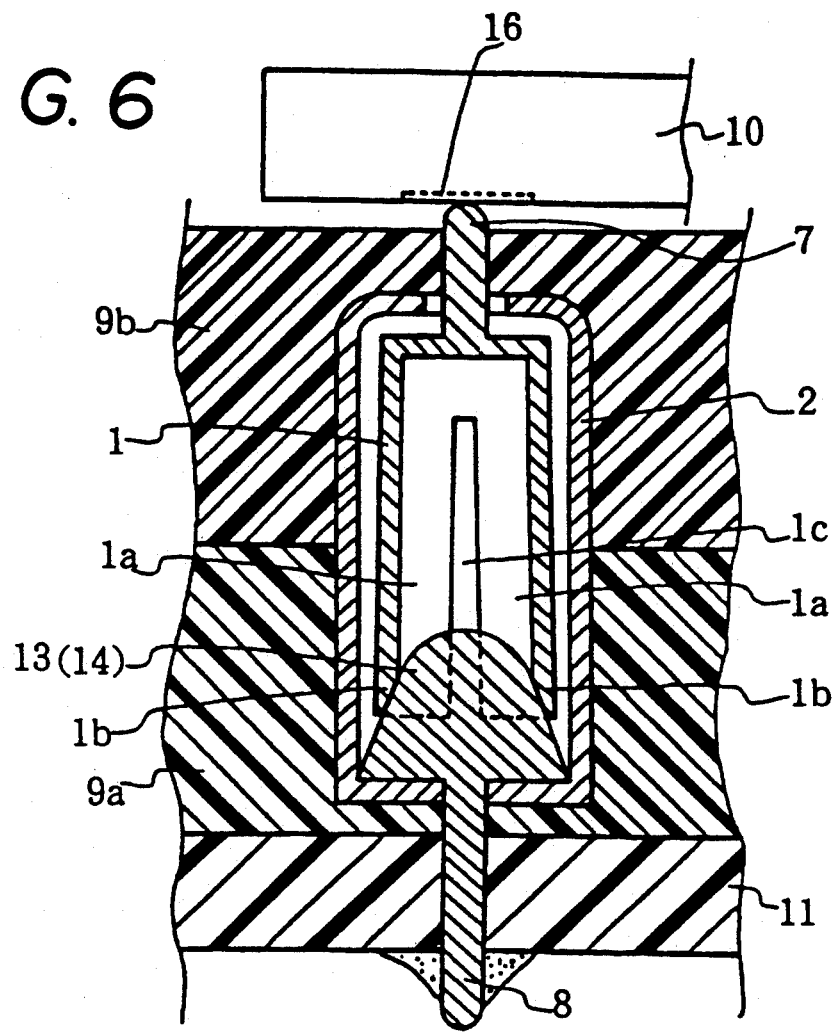
FIG. 6 is a sectional view showing a state that a connector body comprising the pressure connecting device shown in FIG. 5, and an insulating base member with the pressure connecting device disposed therein is mounted on a wiring board, for the purposes of showing an electrical connection of the electric part.

As is shown in FIG. 6, by pushing down the terminal of the electric part, such as conductive pad 16 of the leadless IC 10 or the like, after the same is mounted on the male terminal 7 disposed at the tail end of the inner jacket member 1, the inner jacket member 1 is pushed into the outer jacket member 2. As a result, the front end portions 1b of the split elements 1a are pushed outwardly from inside by the slant projecting portion 14 in order to dilate the split elements 1a against elasticity thereof, so that the inner jacket member 1 would be allowed to contract. Thus, while accumulating elastic force because of the dilation of the split elements 1a and closing because of the restoring force thereof, the inner jacket member 1 is expanded to cause the male terminal 7 to be contacted the terminal of the electric part under pressure.

The male terminal 8 disposed at the tail end of the outer jacket member 2 is connected to the through-hole 12 as in the preceding embodiment. On the contrary, it may be designed such that the male terminal 7 disposed at the inner jacket member 1 is connected to the wiring board 11, and the male terminal 8 disposed at the outer jacket member 2 is connected to the terminal of the electric part, such as conductive pad 16 of the leadless IC, etc., under pressure.

As described in the foregoing, a pressure connecting device of the present invention is constituted such that the split elements of the inner jacket member nested in the outer jacket member are dilated and contracted to relatively expand the inner and outer jacket members in order to obtain a pressure contact with an electric part. Accordingly, there can be provided an indented nest type pressure connecting device without a coil spring as in the conventional pressure connecting device. Thus, the number of component parts can be reduced, and a cost-reduction can be achieved.

What is claimed is:

1. A nest type pressure connecting device comprising a an inner jacket member having split elements split by grooves and opened up at a front end face thereof, an outer jacket member with the inner jacket member inserted therein first from said front said outer jacket member having end, an inner jacket member pressing portion formed therein in such a manner as to be opposite said front end of said inner jacket member and adapted to push front end portions of said split elements, which are split by said split grooves, inwardly from outside against elasticity thereof in order to close said inner jacket member when said inner jacket member is pushed into said outer jacket member, and a male terminal disposed at a tail end of either of said outer and inner jacket members and adapted to contact an electric part under pressure.

2. A nest type pressure connecting device as claimed in claim 1, wherein said inner jacket member pressing portion for closing said inner jacket member is a slant pressing portion.

3. A nest type pressure connecting device as claimed in claim 1, wherein said inner jacket member pressing portion for closing said inner jacket member is a protrusion.

4. A nest type pressure connecting device comprising a an inner jacket member having split elements split by grooves and opened up at a front end face thereof, an outer jacket member with the inner jacket member inserted therein first from said front end, said outer jacket member having an inner jacket member pressing portion formed therein in such a manner as to be opposite said front end of said inner jacket member and adapted to push front end portions of said split elements, which are split by said split grooves, outwardly from inside against elasticity thereof in order to dilate said inner jacket member when said inner jacket member is pushed into said outer jacket member, and a male terminal disposed at a tail end of either of said outer and inner jacket members and adapted to contact an electric part under pressure.

5. A nest type pressure connecting device as claimed in claim 4, wherein said inner jacket member for dilating said inner jacket member is formed of a slant projecting portion converging inwardly from an inner bottom wall of said outer jacket member.

* * * * *